United States Patent
Aday et al.

(10) Patent No.: US 10,516,092 B2
(45) Date of Patent: Dec. 24, 2019

(54) INTERFACE SUBSTRATE AND METHOD OF MAKING THE SAME

(71) Applicant: QUALCOMM Incorporated, San Diego, CA (US)

(72) Inventors: Jon Gregory Aday, Escondido, CA (US); Hong Bok We, San Diego, CA (US); Steve Joseph Bezuk, Poway, CA (US); Nicholas Ian Buchan, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/256,501

(22) Filed: Sep. 2, 2016

(65) Prior Publication Data
US 2017/0323926 A1 Nov. 9, 2017

Related U.S. Application Data

(60) Provisional application No. 62/333,038, filed on May 6, 2016.

(51) Int. Cl.
| | |
|---|---|
| *H01L 27/20* | (2006.01) |
| *H01L 41/113* | (2006.01) |
| *H01L 23/31* | (2006.01) |
| *H01L 23/00* | (2006.01) |
| *H01L 23/498* | (2006.01) |
| *H01L 21/78* | (2006.01) |
| *H01L 21/56* | (2006.01) |

(Continued)

(52) U.S. Cl.
CPC ........ *H01L 41/1132* (2013.01); *H01L 21/561* (2013.01); *H01L 21/76877* (2013.01); *H01L 21/78* (2013.01); *H01L 23/3128* (2013.01); *H01L 23/3135* (2013.01); *H01L 23/49816* (2013.01); *H01L 23/49827* (2013.01); *H01L 23/49838* (2013.01); *H01L 23/49866* (2013.01); *H01L 24/03* (2013.01); *H01L 24/09* (2013.01); *H01L 24/11* (2013.01); *H01L 24/14* (2013.01); *H01L 24/17* (2013.01); *H01L 41/053* (2013.01); *H01L 2224/0401* (2013.01)

(58) Field of Classification Search
CPC ............... H01L 27/20; H01L 23/49866; H01L 21/76877; H01L 21/561; H01L 24/11; H01L 24/03; H01L 21/78; H01L 23/3135; H01L 41/1132; H01L 24/14; H01L 24/17; H01L 23/49827; H01L 23/49838; H01L 23/49816
USPC ........................................................ 257/254
See application file for complete search history.

(56) References Cited

U.S. PATENT DOCUMENTS

| | | | |
|---|---|---|---|
| 6,064,114 A * | 5/2000 | Higgins, III | ........ H01L 23/3114 257/698 |
| 6,232,152 B1 * | 5/2001 | DiStefano | ............... H01L 21/56 438/124 |
| 7,888,179 B2 | 2/2011 | Kagaya et al. | |

(Continued)

*Primary Examiner* — Marcos D. Pizarro
*Assistant Examiner* — Sue Tang
(74) *Attorney, Agent, or Firm* — Muncy, Geissler, Olds & Lowe

(57) ABSTRACT

A package may include a substrate and a semiconductor die with the substrate having a smaller width than the semiconductor die and encapsulated in a mold compound. In one example, the package may be a wafer level package that allows an external connection on the backside of the package to enable manufacturing in a panel or wafer form.

10 Claims, 6 Drawing Sheets

(51) Int. Cl.
*H01L 21/768* (2006.01)
*H01L 41/053* (2006.01)

(56) References Cited

U.S. PATENT DOCUMENTS

| | | |
|---|---|---|
| 7,993,975 B2 | 8/2011 | Watanabe et al. |
| 8,227,264 B2 | 7/2012 | Andry et al. |
| 2007/0107827 A1* | 5/2007 | Takahashi ............... B32B 41/00 156/64 |
| 2010/0213592 A1 | 8/2010 | Ishii et al. |
| 2012/0146209 A1* | 6/2012 | Hu .......................... H01L 23/36 257/692 |
| 2014/0252573 A1* | 9/2014 | Lin ......................... H01L 24/19 257/666 |
| 2015/0123931 A1* | 5/2015 | Kitchens ............... G06F 3/0436 345/174 |
| 2016/0172289 A1 | 6/2016 | Kung et al. |

* cited by examiner

# INTERFACE SUBSTRATE AND METHOD OF MAKING THE SAME

CLAIM OF PRIORITY UNDER 35 U.S.C. § 120

The present Application for Patent claims priority to U.S. Provisional Patent Application No. 62/333,038, entitled "INTERFACE SUBSTRATE AND METHOD OF MAKING THE SAME," filed May 6, 2016, assigned to the assignee hereof, and expressly incorporated herein by reference in its entirety.

FIELD OF DISCLOSURE

This disclosure relates generally to substrates, and more specifically, but not exclusively, to wafer level package substrates.

BACKGROUND

Conventional wafer level package (WLP) use photo-dielectric material for layer to layer passivation and connection. However, photo-dielectric material is a thinner and physically weaker material than that used for substrate cores. In addition, conventional substrate based and leadframe based packages are bigger in size than semiconductor dies coupled to the WLPs. This creates a problem when the package size is critical, such as when the package size must be the same as the semiconductor die coupled to the package. In addition, certain sensor applications require alternative interconnection methods than can be provided with a WLP since the materials and processes used would impact the performance of the sensing components.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a semiconductor package comprises: a semiconductor die; a substrate; a mold compound configured to encapsulate the substrate; a first plurality of pads on a first side of the substrate; a plurality of first contacts on the first plurality of pads; a second plurality of pads on a second side of the substrate; a plurality of second contacts on the second plurality of pads, the plurality of second contacts coupled to the semiconductor die; a plurality of interconnects 180 that extend from the first plurality of pads to the second plurality of pads; and a redistribution layer embedded in the substrate proximate the second side of the substrate.

In another aspect, a sensor package comprises: a sensor configured to receive an input and transmit an output; a thin film transistor connected to the sensor; a piezoelectric layer on a first side of the thin film transistor opposite the sensor; a first metal layer configured to encapsulate the piezoelectric layer; a first mold compound configured to encapsulate the first metal layer; a second metal layer proximate to the first metal layer; a conductive layer proximate to the second metal layer; a substrate connected to the conductive layer opposite the second metal layer; and an external connection coupled to the substrate opposite the conductive layer.

In still another aspect, a method for forming a semiconductor package comprises: forming a plurality of substrates, each of the plurality of substrates has a first width; forming a plurality of semiconductor dies on the wafer, each of the plurality of semiconductor dies has a second width larger than the first width; placing the plurality of substrates on the plurality of semiconductor dies; attaching each of the plurality of substrates to a corresponding one of the plurality of semiconductor dies; applying a mold compound to the wafer, the mold compound configured to encapsulate the plurality of substrates; and singulating the wafer to form a plurality of semiconductor packages, each of the plurality of semiconductor packages comprises one of the plurality of substrates and one of the plurality of semiconductor dies and each of the plurality of semiconductor packages has a third width approximately equal to the second width.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
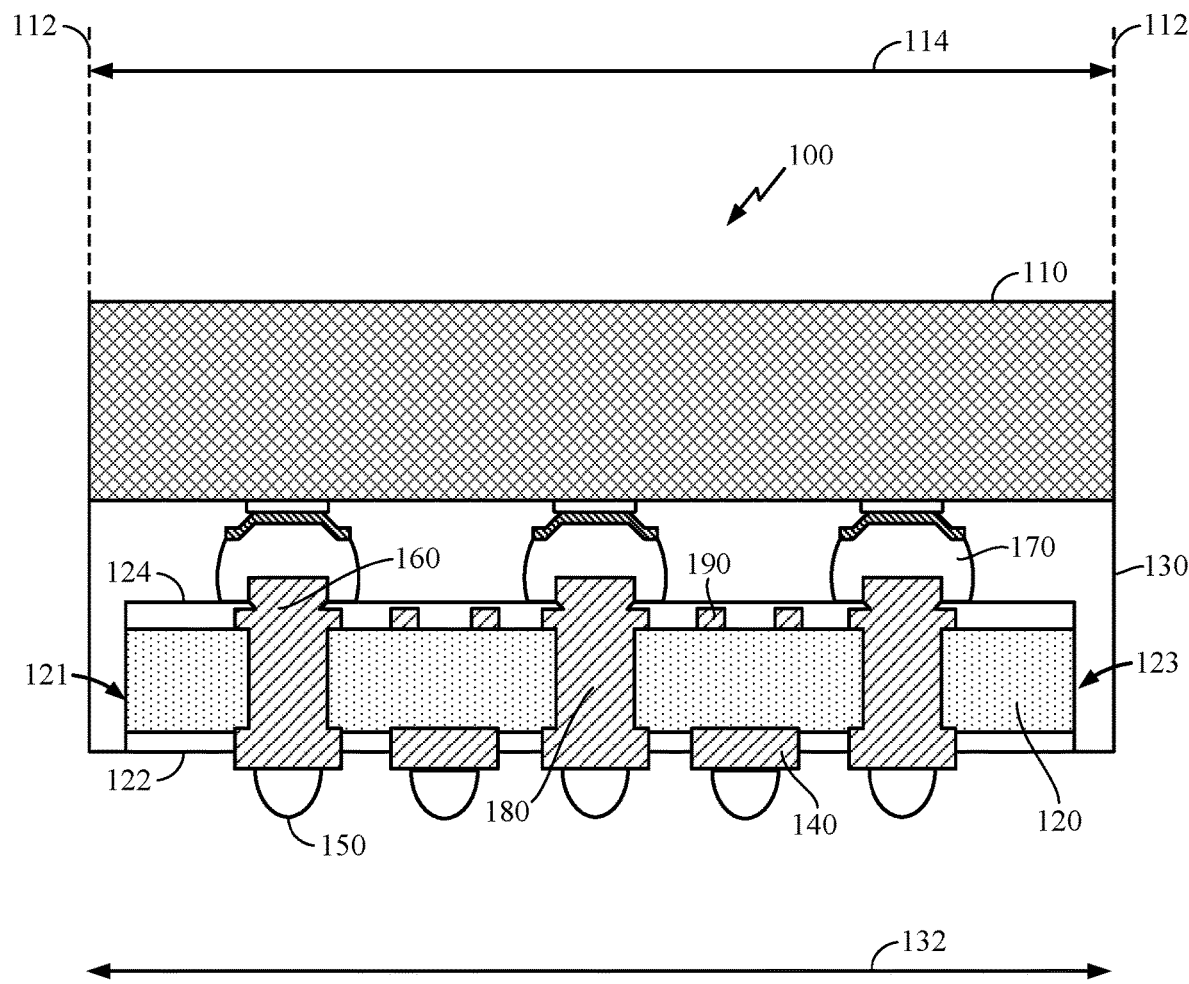
FIG. 1 illustrates an exemplary semiconductor package structure in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein address the industry needs, as well as other previously unidentified needs, and mitigate shortcomings of the conventional methods, apparatus, and systems. For example, an interface substrate according to some examples of the disclosure may include a thinner, smaller interface substrate assembly that is equal to or smaller in size than a semiconductor die coupled to the assembly. In another example, an interface substrate assembly process may use conventional die bonding and reflow processes or laser assist bonding to manufacture the thinner, smaller interface substrate assembly. This may allow the interface substrate to replace a conventional redistribution layer (RDL) manufacturing process so that known-good substrates can be assembled with semiconductor dies to minimize die loss and substrate loss. Furthermore, an interface substrate package may be molded to increase the assembly reliability and ball reliability better than WLPs. Benefits of the examples described herein include processing in wafer form that allows a higher throughput process than conventional individual and strip based structures, manufacturing process may use conventional wafer handling infrastructure without the need for a RDL process step, may provide a more robustness package for low k wafer nodes, a packaged part may have the same form factor as a WLP, may provide an interconnection with the package backside for applications (such as sensor applications) where part of the package surface needs to be free of other materials thus avoiding single unit processing necessitated by interconnections on the side of the package, and minimize manufacturing process costs and failure costs by using known-good substrates and known-good die assemblies in the package.

FIG. 1 illustrates an exemplary semiconductor package structure in accordance with some examples of the disclosure. As shown in FIG. 1, a semiconductor package 100 (e.g. a wafer level chip scale package) may include a semiconductor die 110 (e.g. a logic die, memory die, or integrated circuit), a substrate 120, and a mold compound 130 encapsulating the substrate 120. The semiconductor die has an outer perimeter 112 shown with dashed lines in FIG. 1 and a width 114. The substrate 120 may include a first sidewall 121, a second sidewall 123, a first plurality of pads 140 on a first side 122 of substrate 120 opposites a second side 124 of the substrate 120, a plurality of first contacts 150 (e.g. solder bumps or solder balls) on the first plurality of pads 140 for enabling an external connection (not shown), a second plurality of pads 160 on the second side 124, a plurality of second contacts 170 (e.g. solder bumps or solder balls) on the second plurality of pads 160 for enabling connection to the semiconductor die 110, a plurality of interconnects 180 (e.g. copper pillars or electrically conductive vias) extending from the first plurality of pads 140 to the second plurality of pads 160 for connecting the first plurality of pads 140 to the second plurality of pads 160, and a redistribution layer 190 embedded in the substrate 120 near the second side 124. The substrate 120 may be composed of ceramic and/or organic materials, for example, and may have a smaller width than the semiconductor die 110. The mold compound 130 may encapsulate the substrate 120 only with a width 132 sized to match the width 114 of the semiconductor die 110 such that the semiconductor package 100 has the same width as the semiconductor die 110 and the sidewalls 121 and 123 of the substrate 120 are not exposed.

Figure 2:
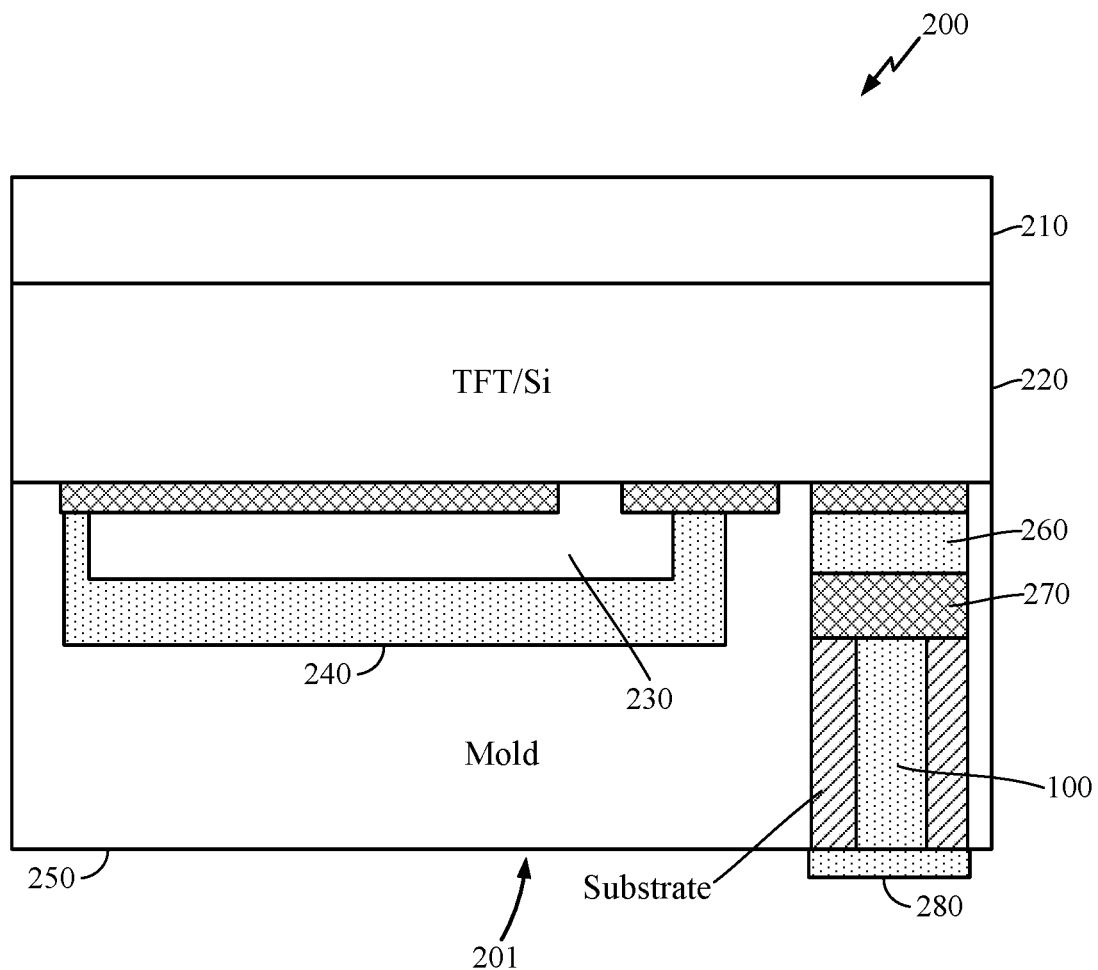
FIG. 2 illustrates an exemplary sensor application of a substrate in accordance with some examples of the disclosure.

FIG. 2 illustrates an exemplary sensor application of a substrate in accordance with some examples of the disclosure. As shown in FIG. 2, a sensor package 200 may include a platen 210 (e.g. for a finger print sensor), a thin film transistor (TFT) 220 (e.g. a silicon TFT) connected to the platen 210, a piezoelectric layer 230, a first metal layer 240 (e.g. a copper layer), a mold compound 250, a second metal layer 260 (e.g. a copper layer), a conductive layer 270 (e.g. anisotropic conductive film (ACF) or solder), and the substrate package 100 with an external connection 280 on a backside 201 of the sensor package 200. This will allow wafer level processing because the external connection 280 does not extend to either side of the package and will not be compromised by a singulation process of the wafer. The TFT 220, piezoelectric layer 230 and the first metal layer 240 comprise an active circuitry area of the sensor 210 and are located on one side of the sensor package 200 opposite the semiconductor package 100. This will allow the active circuitry area to be separate from the semiconductor package 100 without interference or loss of area under the sensor 210. The piezoelectric layer 230 may comprise, for example, piezoelectric materials that may be employed according to various implementations include piezoelectric polymers having appropriate acoustic properties. For example, an acoustic impedance between about 2.5 MRayls and 5 MRayls. Specific examples of piezoelectric materials that may be employed include ferroelectric polymers such as polyvinylidene fluoride (PVDF) and polyvinylidene fluoride-trifluoroethylene (PVDF-TrFE) copolymers. Examples of PVDF copolymers include 60:40 (molar percent) PVDF-TrFE, 70:30 PVDF-TrFE, 80:20 PVDF-TrFE, and 90:10 PVDR-TrFE. Other examples of piezoelectric materials that may be employed include Teflon® and other PTFE polymers, polyvinylidene chloride (PVDC) homopolymers and copolymers, polytetrafluoroethylene (PTFE) homopolymers and copolymers, and diisopropylammonium bromide (DI-PAB).

Figure 3A:
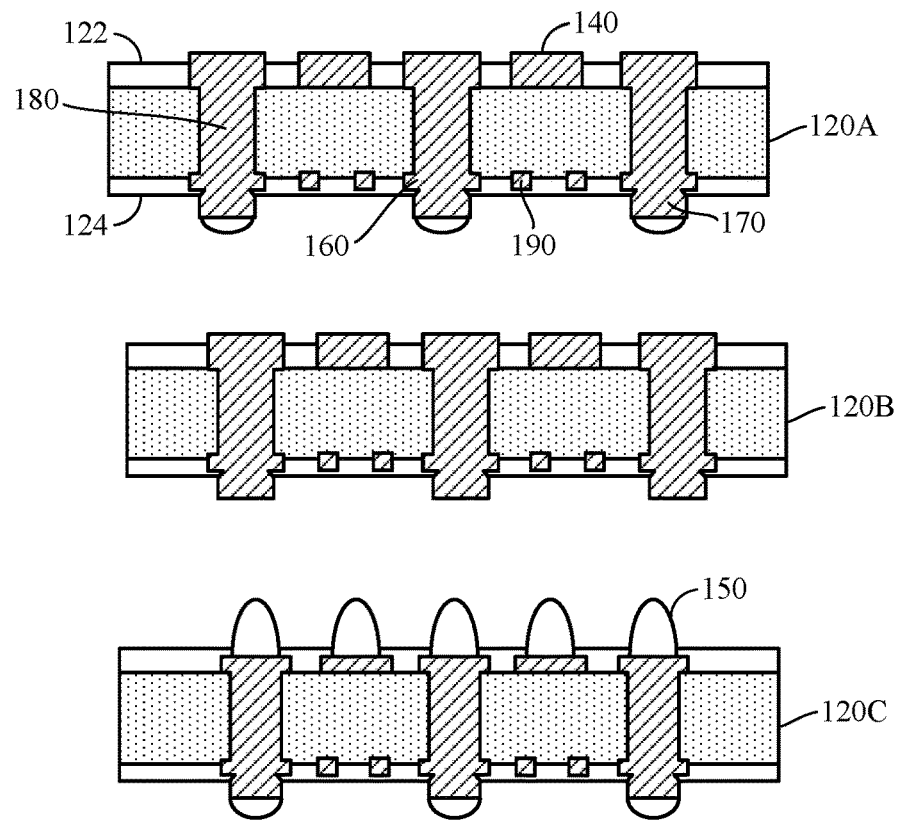
FIGS. 3A-D illustrate an exemplary method for fabrication of a WLP with a substrate in accordance with some examples of the disclosure.
Figure 3B:
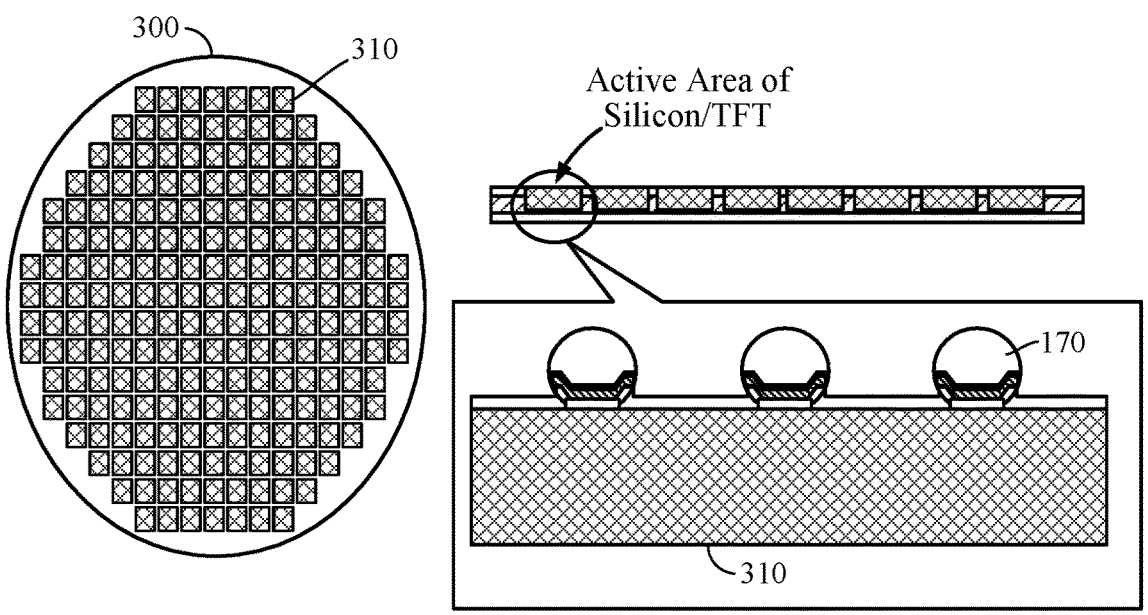

FIGS. 3A-D illustrate an exemplary method for fabrication of a WLP with a substrate in accordance with some examples of the disclosure. As shown in FIG. 3A, a substrate 120 is formed. The substrate 120 may be one of several configurations depending on the intended application. For example, a substrate 120A may include the first plurality of pads 140 on the first side 122 of substrate 120A opposites the second side 124 of the substrate 120A, the second plurality of pads 160 on the second side 124, the plurality of second contacts 170 (e.g. solder bumps or solder balls) on the second plurality of pads 160, and the plurality of interconnects 180 extending from the first plurality of pads 140 to the second plurality of pads 160 for connecting the first plurality of pads 140 to the second plurality of pads 160, and the redistribution layer 190 embedded in the substrate 120A. In another example, a substrate 120B may include the first plurality of pads 140 on the second plurality of pads 160, and the plurality of interconnects 180 extending from the first plurality of pads 140 to the second plurality of pads 160 for connecting the first plurality of pads 140 to the second plurality of pads 160 and the redistribution layer 190. In yet another example, a substrate 120C may include the first plurality of pads 140, the plurality of first contacts 150 (e.g. solder bumps or solder balls) on the first plurality of pads 140, the second plurality of pads 160, the plurality of second contacts 170 (e.g. solder bumps or solder balls) on the second plurality of pads 160, the plurality of interconnects 180 extending from the first plurality of pads 140 to the second plurality of pads 160 for connecting the first plurality of pads 140 to the second plurality of pads 160, and the redistribution layer 190. Next in FIG. 3B, a wafer 300 is formed with appropriate surface finish and/or pad stack. The wafer 300 may include a plurality of semiconductor dies 310 (e.g. semiconductor die 110) and, as in this example, a plurality of second contacts 170 for each of the corresponding plurality of semiconductor dies 310.

Figure 3C:
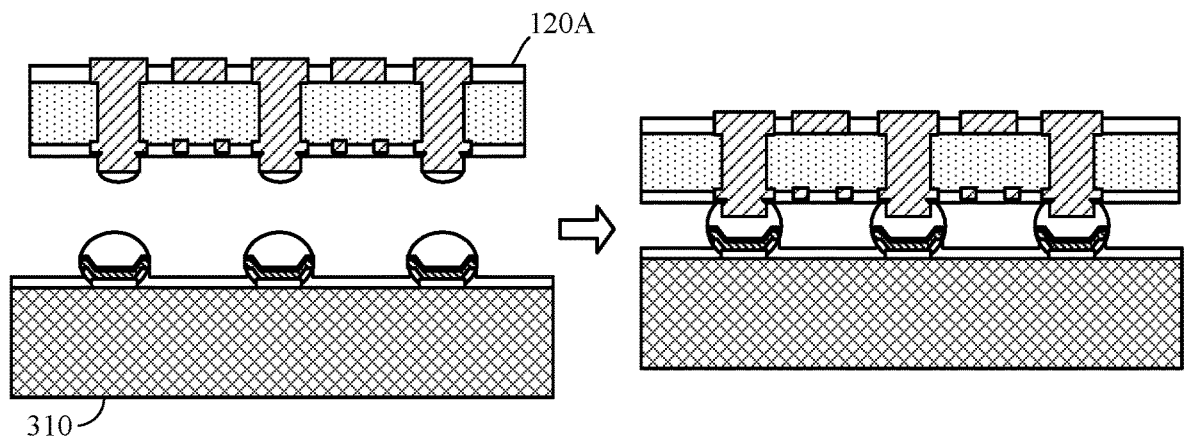
Figure 3D:
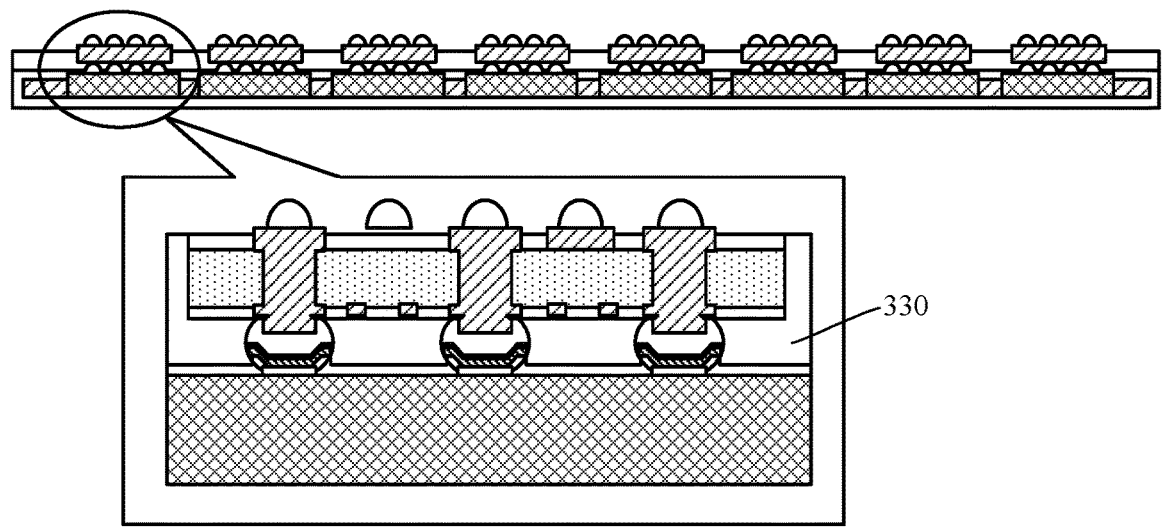

Next in FIG. 3C, a plurality of substrates 120A, for example, are placed on a corresponding one of the plurality of semiconductor dies 310 and a solder reflow process is applied to connect one of the plurality of substrates 120A to a corresponding one of the plurality of semiconductor dies 310. Alternatively, a curing process may be used to connect one of the plurality of substrates 120A to a corresponding one of the plurality of semiconductor dies 310 if a ACF layer is used instead of the plurality of second contacts 170. Next in FIG. 3D, a wafer level mold compound 330 is applied to encapsulate the plurality of substrates 120A such that the plurality of semiconductor dies 310 are free of mold compound 330. Then, an optional pad cleaning process may be applied the wafer 300 if desired and an optional solder ball attachment process may be applied to the plurality of substrates 120A for a ball grid array (BGA) application, for instance, or an optional organic solderability protectant (OSP) may be added for a land grid array (LGA) application. Last, the wafer 300 may be singulated to form individual semiconductor packages 100.

Figure 4:
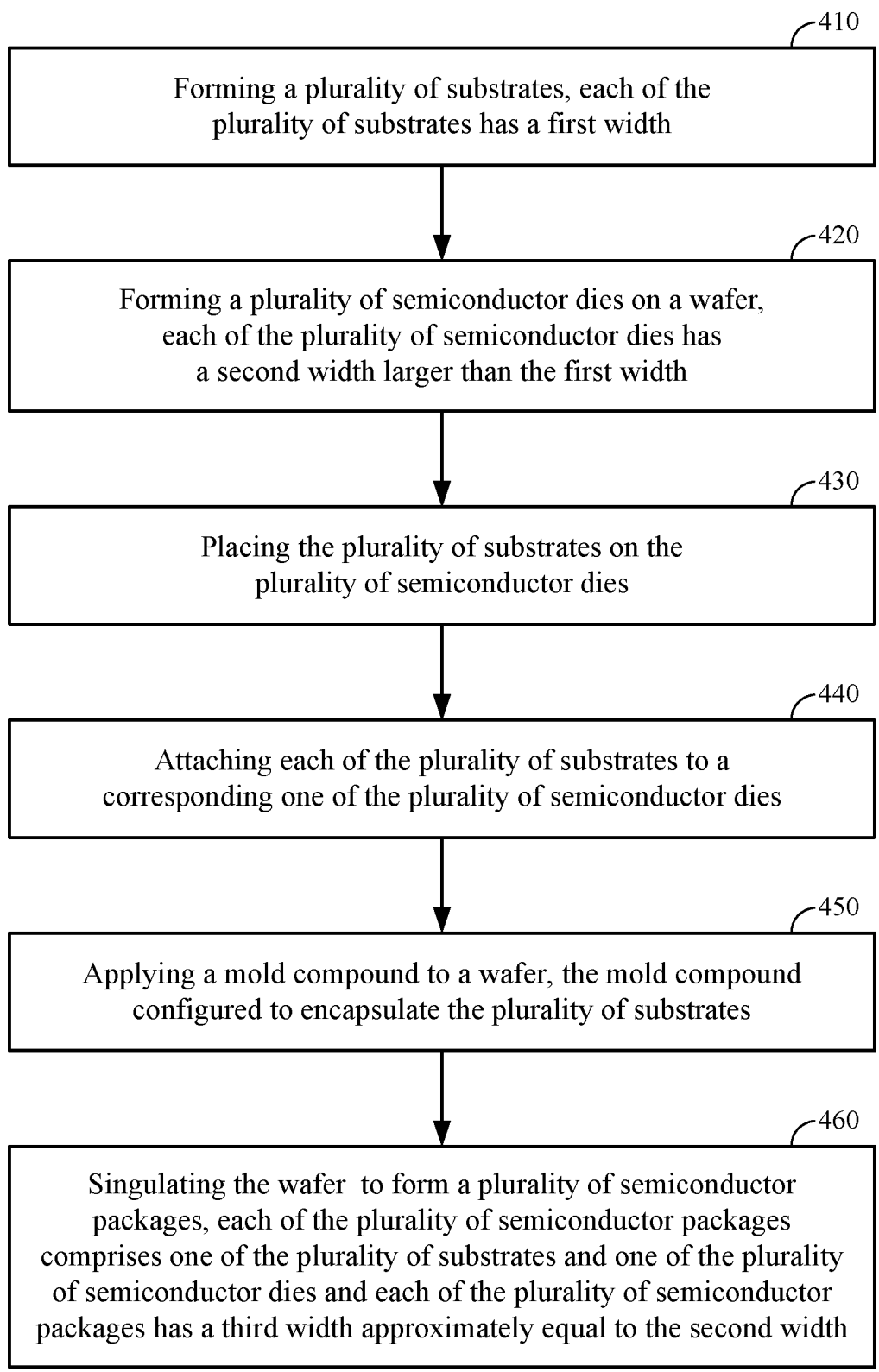
FIG. 4 illustrates an exemplary method for fabrication of a WLP in accordance with some examples of the disclosure.

FIG. 4 illustrates an exemplary method for fabrication of a WLP in accordance with some examples of the disclosure. As shown in FIG. 4, a method for forming a semiconductor package begins in block 410 with forming a plurality of substrates, each of the plurality of substrates has a first width. Next in block 420, the method continues with forming a plurality of semiconductor dies on a wafer, each of the plurality of semiconductor dies has a second width larger than the first width. Next in block 430, the method continues with placing the plurality of substrates on the plurality of semiconductor dies. Next in block 440, the method continues with attaching each of the plurality of substrates to a corresponding one of the plurality of semiconductor dies. Next in block 450, the method continues with applying a mold compound to the wafer, the mold compound configured to encapsulate the plurality of substrates. Next in block 460, the method concludes with singulating the wafer to form a plurality of semiconductor packages, each of the plurality of semiconductor packages comprises one of the plurality of substrates and one of the plurality of semiconductor dies and each of the plurality of semiconductor packages has a third width approximately equal to the second width.

Figure 5:
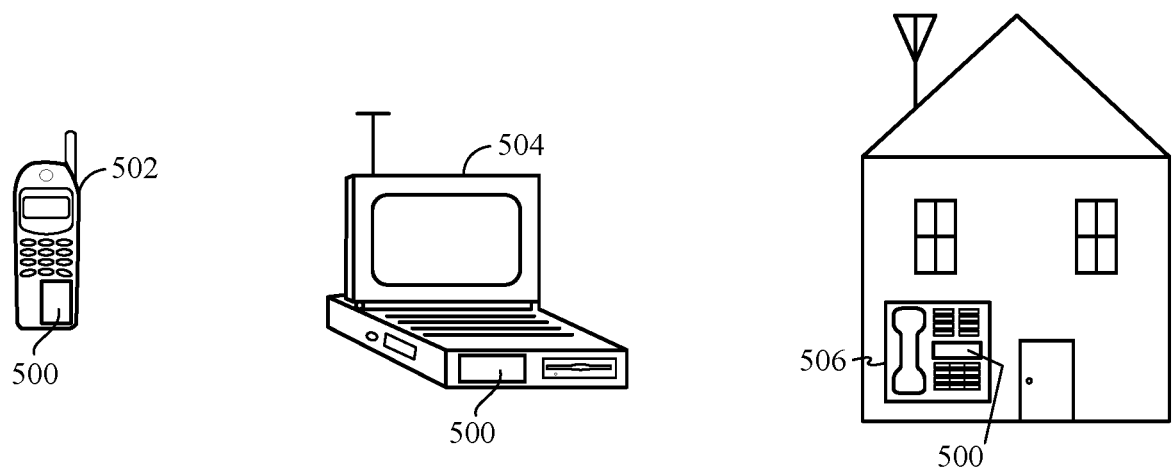
FIG. 5 illustrates various electronic devices that may be integrated with any of the aforementioned interface substrate, integrated device, semiconductor device, integrated circuit, die, interposer, package or package-on-package (PoP) in accordance with some examples of the disclosure.

FIG. 5 illustrates various electronic devices that may be integrated with any of the aforementioned substrates, integrated device, semiconductor device, integrated circuit, die, interposer, package or package-on-package (PoP) in accordance with some examples of the disclosure. For example, a mobile phone device 502, a laptop computer device 504, and a fixed location terminal device 506 may include an integrated device 500 as described herein. The integrated device 500 may be, for example, any of the integrated circuits, dies, integrated devices, integrated device packages, integrated circuit devices, device packages, integrated circuit (IC) packages, package-on-package devices described herein. The devices 502, 504, 506 illustrated in FIG. 5 are merely exemplary. Other electronic devices may also feature the integrated device 500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1, 2, 3A-D, 4 and/or 5 may be rearranged and/or combined into a single component, process, feature or function or embodied in several components, processes, or functions. Additional elements, components, processes, and/or functions may also be added without departing from the disclosure. It should also be noted that FIGS. 1, 2, 3A-D, 4 and/or 5 and its corresponding description in the present disclosure is not limited to dies and/or ICs. In some implementations, FIGS. 1, 2, 3A-D, 4 and/or 5 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A sensor package, comprising:
   a sensor configured to receive an input and transmit an output;
   a thin film transistor connected to the sensor;
   a piezoelectric layer on a first side of the thin film transistor opposite the sensor;
   a first metal layer configured to encapsulate the piezoelectric layer;
   a first mold compound configured to encapsulate the first metal layer;
   a second metal layer proximate to the first metal layer;
   a conductive layer proximate to the second metal layer;
   a substrate connected to the conductive layer opposite the second metal layer; and
   an external connection coupled to the substrate opposite the conductive layer.

2. The sensor package of claim 1, wherein the substrate further comprises:
   a second mold compound configured to encapsulate the substrate;
   a first plurality of pads on a first side of the substrate;
   wherein the external connection comprises a plurality of first contacts on the first plurality of pads;
   a second plurality of pads on a second side of the substrate;
   a plurality of second contacts on the second plurality of pads, the plurality of second contacts coupled to the conductive layer;
   a plurality of interconnects that extend from the first plurality of pads to the second plurality of pads; and
   a redistribution layer embedded in the substrate proximate the second side of the substrate.

3. The sensor package of claim 2, wherein the plurality of first contacts are solder bumps or solder balls and the plurality of second contacts are solder bumps or solder balls.

4. The sensor package of claim 2, wherein the plurality of interconnects are copper pillars or conductive vias.

5. The sensor package of claim 2, wherein the substrate is composed of ceramic or organic materials.

6. The sensor package of claim 1, wherein the conductive layer may be composed of an anisotropic conductive film or solder.

7. The sensor package of claim 1, wherein the external connection extends out of a bottom of the sensor package.

8. The sensor package of claim 1, wherein the piezoelectric layer and the first metal layer are configured as active circuitry for the sensor.

9. The sensor package of claim 8, wherein the active circuitry is located on one side of the sensor package opposite the substrate.

10. The sensor package of claim 1, wherein the sensor package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

* * * * *